United States Patent [19]
Tanamoto et al.

[11] Patent Number: 5,844,279
[45] Date of Patent: Dec. 1, 1998

[54] SINGLE-ELECTRON SEMICONDUCTOR DEVICE

[75] Inventors: Tetsufumi Tanamoto, Kawasaki; Riichi Katoh, Yokohama, both of Japan

[73] Assignee: Kabushiki Kaisha Toshiba, Kawasaki, Japan

[21] Appl. No.: 713,365

[22] Filed: Sep. 13, 1996

[30] Foreign Application Priority Data

Sep. 14, 1995 [JP] Japan ................................ 7-236642
Mar. 4, 1996 [JP] Japan ................................ 8-045697

[51] Int. Cl.$^6$ ................................................ H01L 27/01
[52] U.S. Cl. ........................... 257/347; 257/37; 257/39
[58] Field of Search ............................ 257/347, 30, 37, 257/38, 39

[56] References Cited

U.S. PATENT DOCUMENTS 5,485,028 1/1996 Takahashi et al. ................. 257/347
5,567,966 10/1996 Hwang ................................ 257/347

OTHER PUBLICATIONS

IEDM 94, Pp. 938–940, 1994, Yasuo Takahashi, et al., "Conductance Oscillations of a Si Single Electron Transistor At Room Temperature", Dec. 1994.

Appl. Phys. Lett., vol. 67, No. 7, pp. 938–940, E. Leobandung, et al., "Observation of Quantum Effects and Coulomb Blockade in Silicon Quantum–Dot Transistors at Temperatures Over K", Aug. 1995.

Primary Examiner—Mark V. Prenty
Attorney, Agent, or Firm—Oblon, Spivak, McClelland, Maier & Neustadt, P.C.

[57] ABSTRACT

A semiconductor device which includes, a substrate, an insulating layer formed on the substrate, a silicon layer having an exposed surface constituted by a Si (100) face, the silicon layer being provided with a tapered recess having a bottom at which a part of the silicon layer is remained without exposing the insulating layer, a first conductive region constituted by the silicon layer remaining at the bottom of the tapered recess, a second and a third conductive regions formed on both sides of the tapered recess respectively, a first insulating film formed on an inner surface of the tapered recess, and an electrode formed in the tapered recess. A flow of electron resulting from the tunneling effect from the second conductive region via the first insulating film to the third conductive region is controlled by controlling a voltage to be impressed onto the electrode.

21 Claims, 7 Drawing Sheets

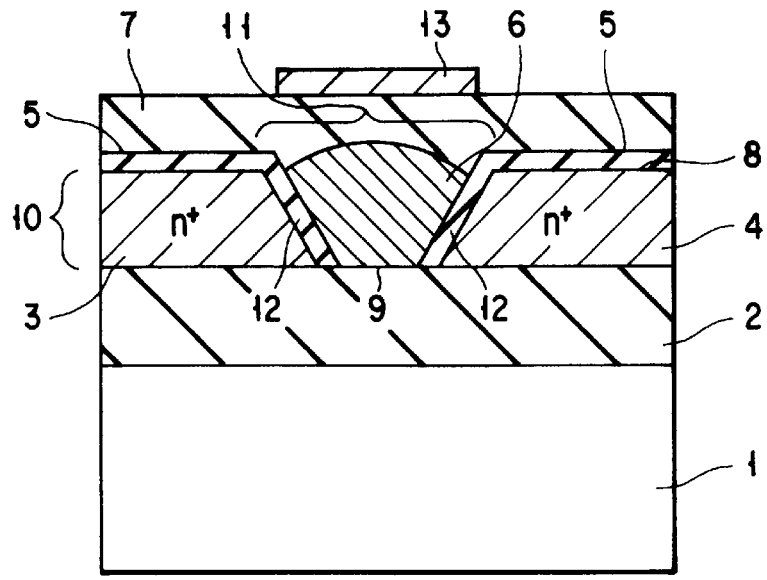
F I G. 1
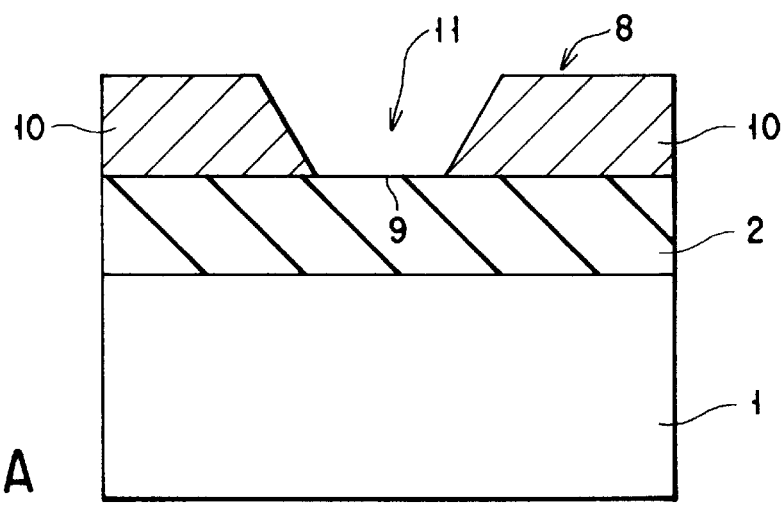
F I G. 2A
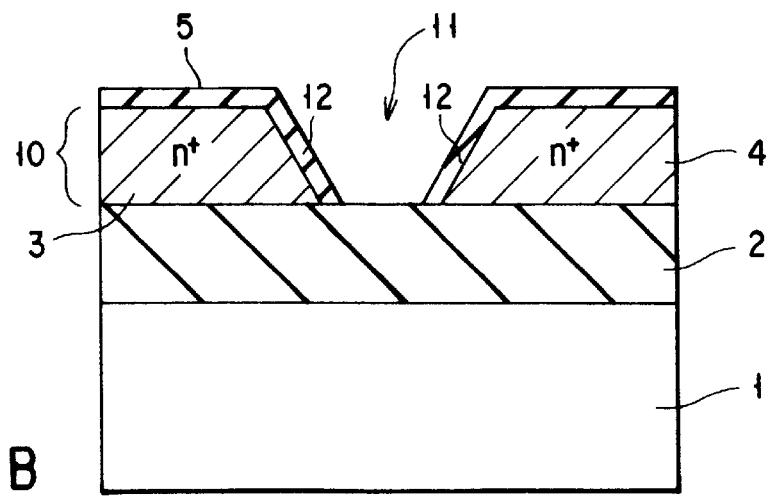
F I G. 2B

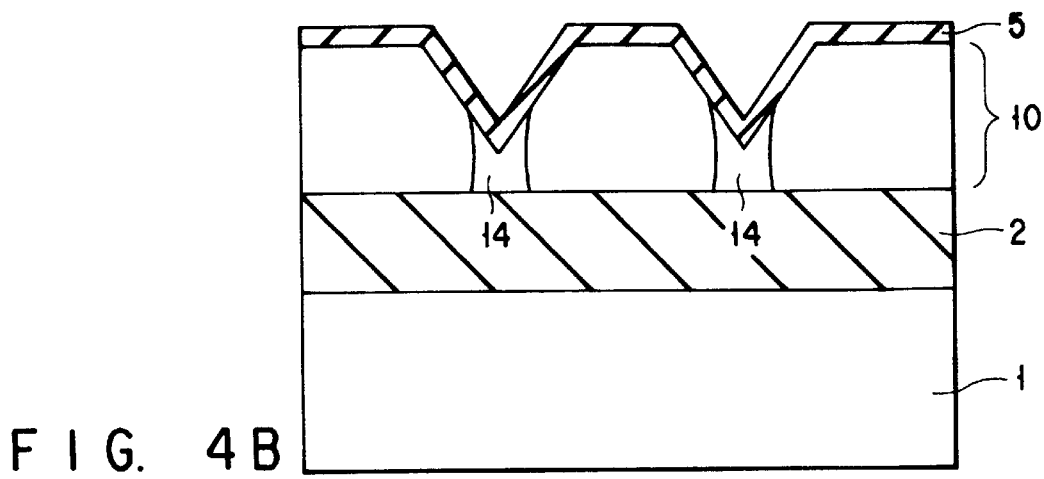
F I G. 4B
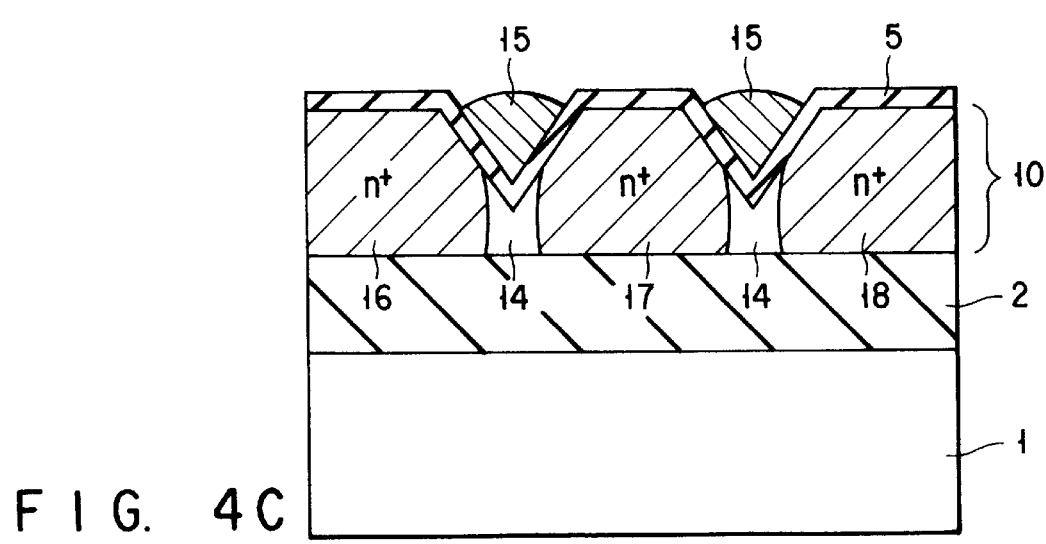
F I G. 4C
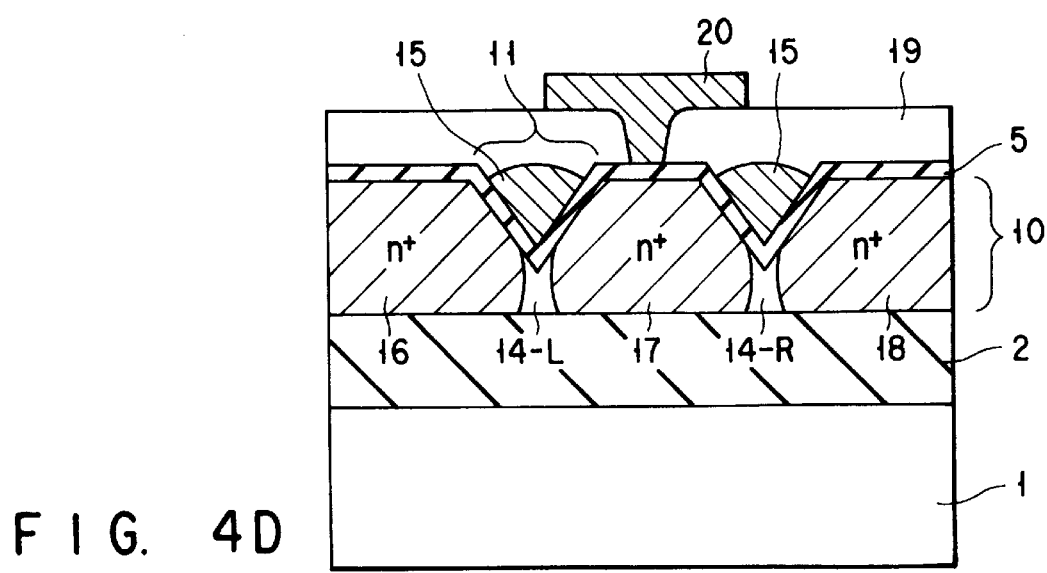
F I G. 4D

5,844,279

SINGLE-ELECTRON SEMICONDUCTOR DEVICE

BACKGROUND OF THE INVENTION

1. Field of the Invention

This invention relates to a semiconductor device which can be operated with low power consumption, and in particular to a single-electron device which functions taking advantage of a single-electron tunnel effect.

2. Description of the Related Art

There is known a quantum effect device called a single-electron device which is capable of controlling individual electron flow. In this device, a conductive region called an island is formed via an energy barrier or an insulating layer each constituting a tunnel junction between the source/drain electrodes. By mounting a control electrode on this island and controlling the voltage impressed on this control electrode, the electrons can be allowed to flow one by one from the source via the island to the drain by taking advantage of a tunnel effect.

Namely, in this single-electron device, the control of individual electron is effected by taking advantage of the Coulomb blockade effect. The principle of the Coulomb blockade effect is based on the fact that if the capacitance C between the source and the island is sufficiently small and at the same time if the charging energy ($e2/2C$) accumulated in a tunnel junction constituted by an insulating layer is sufficiently large ($e2/2C>kT$) in relative to a temperature fluctuation (~kT), the tunneling of electrons passing from the source to the island can be controlled.

Therefore, when, taking advantage of this phenomenon, a control electrode is formed on the island and a voltage is impressed on the control electrode, a threshold value would be found with respect to the current-voltage characteristics. Based on the presence of this threshold, there have been proposed a many number of proposals for the application of the phenomenon to a three-terminal transistor, memory, etc. Since individual electron is fundamentally dealt with in the aforementioned single-electron device, it is expected that the device can be operated with a low power consumption.

If the Coulomb blockade effect is to be utilized, the formation of a very small tunnel junction in the order of aF(10–15) as a size for a capacitance is required.

Although there has been reported the confirmation of performance of the coulomb blockade effect at room temperature by making use of a special technique as disclosed for instance in IEDM T93-541 (Yano et al) or IEDM T94-938 (Takahashi et al), it is very difficult according to the ordinary photolithographic technique (in the order of submicron) commonly employed for manufacturing a semiconductor device to prepare such a small tunnel junction (several tens nanometers or less).

As explained above, if it is desired to enable the single-electron device to be operated at room temperature, a micro-working of the order of several tens nanometers is required for the manufacture of such a single-electron device. Therefore, it is impossible according to a fine-working technique employing the conventional photolithography to prepare the single-electron device which is capable of being operated at room temperature.

SUMMARY OF THE INVENTION

Accordingly, an object of the present invention is to provide a single-electron device which is capable of being operated at room temperature and can be manufactured by an ordinary manufacturing process.

Namely, according to the present invention, there is provided a semiconductor device which comprises;

a substrate structure including a silicon substrate, an insulating layer formed on the silicon substrate, and a silicon layer having an exposed surface constituted by a Si (100) face, said silicon layer being provided with a tapered recess having a bottom at which a part of said insulating layer is exposed;

a first insulating film formed on an inner surface of said tapered recess, which enables an electron to pass therethrough under a tunneling effect;

a first conductive region formed in said tapered recess;

a second and a third conductive regions formed on both sides of said tapered recess respectively; and an electrode coupled to said first conductive region;

wherein a flow of electron resulting from the tunneling effect from said second conductive region via said first insulating film to said first conductive region, and from said first conductive region via said first insulating film to said third conductive region is controlled by controlling a voltage to be impressed onto said electrode.

According to the present invention, there is further provided a semiconductor device which comprises;

a substrate;

an insulating layer formed on the silicon substrate;

a silicon layer having an exposed surface constituted by a Si (100) face, said silicon layer being provided with a tapered recess having a bottom at which a part of said silicon layer is remained without exposing said insulating layer;

a first conductive region constituted by said silicon layer remaining at said bottom of said tapered recess; and a second and a third conductive regions formed on both sides of said tapered recess respectively.

Further, according to the present invention, there is also provided a semiconductor device which comprises;

a substrate structure including a silicon substrate, an insulating layer formed on the silicon substrate, and a silicon layer having an exposed surface constituted by a Si (100) face, said silicon layer being provided with a plurality of tapered recesses each having a bottom at which a part of said silicon layer is remained without exposing said insulating layer;

a plurality of first conductive regions each constituted by said silicon layer remaining at said bottom of said tapered recess;

a second conductive regions formed on one outermost side of said plurality of first conductive regions;

a third conductive regions formed on the other outermost side of said plurality of first conductive regions;

an insulating film formed on an inner surface of each of said tapered recesses and on each of said first conductive regions;

a first electrode formed on a portion of said insulating film that is formed on said inner surface of each of said tapered recesses; and a second electrode formed on a portion of said insulating film that is formed on said first conductive region.

According to the present invention, there is further provided a semiconductor device which comprises;

a semiconductor substrate;

a conductive region formed on said semiconductor substrate; and a tunneling barrier constituted by a conductive region connected to said conductive region and having an area smaller than that of said conductive region on said semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross-sectional view showing a single-electron device according to a first embodiment of this invention;

FIGS. 2A to 2C are cross-sectional views illustrating a process of manufacturing a single-electron device shown in FIG. 1;

FIGS. 4A to 4D are cross-sectional views illustrating a process of manufacturing a single-electron device shown in FIG. 3;

DETAILED DESCRIPTION OF THE PREFERRED EMBODIMENTS

Figure 2C:
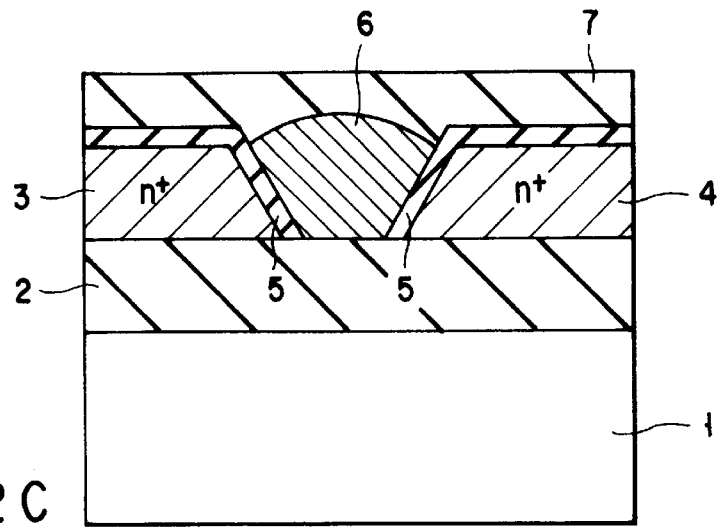

A first embodiment of this invention is featured in that by making use of an SOI (Silicon On Insulator) substrate and anisotropic etching, the structure required for a single-electron device (a tunneling barrier/an island/a tunneling barrier) is manufactured with high controllability and in a very fine size by means of the conventional ULSI technique.

FIG. 1 shows a single-electron device according a first embodiment of this invention. According to this single-electron device, an insulating layer 2 is formed on a silicon substrate 1, and a silicon layer 10 having an upper surface 8 constituted by a (100) face is formed on the insulating layer 2. A part of the upper surface, i.e. (100) face of the silicon layer 10 is anisotropically etched, forming a recessed portion 11. An insulating film 5 is formed on the inner surface 12 of the recessed portion 11. The bottom 9 of the recessed portion 11 is extended to the insulating layer 2, thus exposing a portion of the insulating layer 2.

An island (a first conductive region) 6 made of polysilicon is formed in the recessed portion 11. A source region (a second conductive region) 3 formed of n$^+$-silicon and a drain region (a third conductive region) 4 formed of n$^+$-silicon are formed in the silicon layer 10.

A control electrode 13 is formed on an insulating layer 7 on the island 6. When a voltage is impressed onto this control electrode 13, an individual electron is caused to flow due to a tunneling effect from the source region 3 via the insulating film 5 to the island 6, and then from the island 6 via the insulating film 5 to the drain region 4.

Next, a method of manufacturing the single-electron device shown in FIG. 1 will be explained with reference to FIGS. 2A to 2C.

First of all, the SiO$_2$ insulating layer 2 is formed on the silicon substrate 1, and then the silicon layer 10 having an upper surface 8 constituted by a (100) face is formed on the insulating layer 2 to obtain an SOI substrate as shown in FIG. 2A. The thickness of the silicon layer 10 in this case may be in the range of 10 to 50,000 angstroms, e.g. 500 angstroms.

Then, a part of the silicon layer 10 of the SOI substrate is removed by means of anisotropic etching using a TMAH solution and taking advantage of the (100) face of the silicon layer 10, thereby forming a tapered recessed portion (or a V-shaped recessed portion) 11. This V-shaped recessed portion 11 is formed to such an extent that the bottom 9 thereof reaches to the SiO$_2$ insulating layer 2. Namely, the insulating layer 2 is partially exposed at this bottom portion 9. The dimension of the opening of the V-shaped recessed portion 11 may be in the range of 0.002 to 10 μm, e.g. 0.1 μm. The dimension of this degree can be easily manufactured by making use of the ordinary photolithographic technique. As a result, the dimension of the bottom of the V-shaped recessed portion 11 may be in the range of 6 to 10$^5$ angstroms, e.g. 300 angstroms.

Then, as shown in FIG. 2B, an oxide film 5 is formed on the entire surface of the SOI substrate by means of thermal oxidation for instance, thereby forming an oxide (insulating) film 5 also on the inner surface 12 of the V-shaped recessed portion 11. The thickness of the oxide film 5 should preferably be in the range of 5 to 100 angstroms, e.g. 50 angstroms. Thereafter, an n-type impurity, e.g. phosphorus ion is implanted into the silicon layer 10, thereby forming an n-type Si layer to be subsequently formed into the source region 3 and the drain region 4.

Then, as shown in FIG. 2C, the V-shaped recessed portion 11 is filled with polysilicon by the vapor deposition of the polysilicon, thereby forming an island. Thereafter, the insulating layer 7 composed of an oxide film is deposited on the entire surface of the SOI substrate by means of CVD, and then a contact hole (not shown) is formed in the insulating layer 7. Finally, the control electrode 13 is formed on the insulating layer 7, thus accomplishing the manufacture of the single-electron device shown in FIG. 1.

In the above embodiment, the source region 3 and the drain region 4 are formed of an n-type silicon. However, the source region 3 and the drain region 4 may be formed of a p-type silicon. Furthermore, although the island 6 is formed by the vapor deposition of polysilicon in the above embodiment, the island 6 may be formed by an epitaxial growth of polysilicon. It is also possible employ metal such as aluminum in place of polysilicon.

As explained above, according to the first embodiment of this invention, a part of the silicon layer is removed by performing an anisotropic (taper) etching on the (100) face of the thin silicon layer of the SOI substrate, and, after forming an insulating layer such as a silicon oxide film on the inner wall of the etched portion, the etched portion is filled with a metal or polysilicon thereby forming an island region. In this case, the oxide film formed between the island portion and the source/drain regions functions as a tunneling barrier. The capacity of this tunneling barrier portion may be $10^{-18}$ F for instance.

Since an anisotropic (taper) etching is performed on the (100) face of the silicon layer according to the first embodiment of this invention, it is possible to narrow the bottom portion of the V-shaped recessed portion with high controllability, and hence it has become possible, through the formation of an island on this recessed portion, to obtain a single-electron device which can be operated at room temperature.

As explained above, according to the first embodiment of this invention, since the area of the conductive portion of the tunneling barrier is reduced by making use of an SOI substrate and anisotropic (taper) etching of silicon, the mask pattern for the initial photolithography is required to be such that is capable of forming an opening of 0.1 μm in width in a Si layer. The formation of such a mask pattern is certainly possible even with the ordinary photolithographic technique.

Furthermore, it is possible with the employment of the SOI substrate to sufficiently reduce the thickness of each of the gate electrode, the source electrode and the drain electrode, so that the total amount of electric charge in these portions for supplying a single-electron can be minimized.

Next, a second embodiment of this invention will be explained as follows.

In the second embodiment of this invention, an anisotropic etching is performed on the (100) face of the silicon layer of the SOI substrate in such a manner that a V-shaped recess is formed in the silicon layer, leaving a very thin silicon film at the bottom of the V-shaped recess. Namely, a very thin silicon film is left remained on the insulating layer. Therefore, the single-electron device according to the second embodiment of this invention is featured in that the aforementioned very thin silicon film is utilized as conductive layer through which electrons can be passed.

Figure 3:
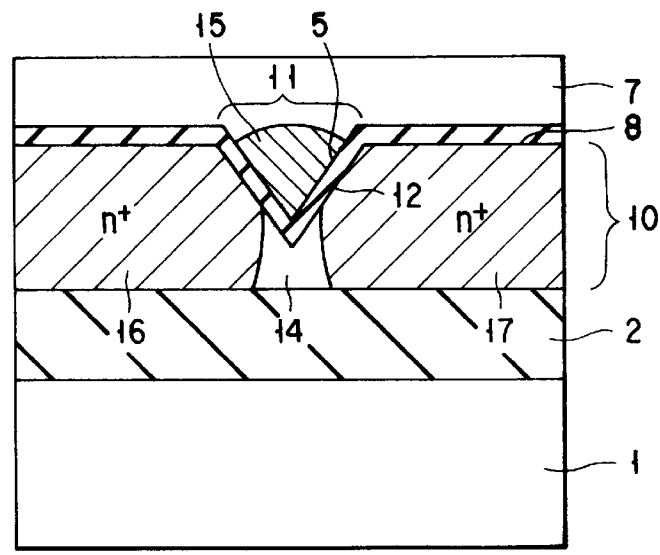
FIG. 3 is a cross-sectional view showing a single-electron device according to a second embodiment of this invention.

FIG. 3 shows a single-electron device according to a second embodiment of this invention. According to this single-electron device, an insulating layer 2 is formed on a silicon substrate 1, and a silicon layer 10 having an upper surface 8 with a (100) face is formed on the insulating layer 2.

A part of the upper surface, i.e. (100) face of the silicon layer 10 is anisotropically etched, forming a recessed portion 11. An insulating film 5 is formed on the inner surface 12 of the recessed portion 11. The bottom of the recessed portion 11 is extended near the insulating layer 2, thus leaving a thin film 14 of silicon over the insulating layer 2. In this case, the thickness of the thin silicon film 14 should preferably be in the range of 2 to $2 \times 10^4$ angstroms, e.g. 300 angstroms.

An electrode 15 made of polysilicon is formed in the recessed portion 11. A first conductive region 16 made of $n^+$-silicon and a second conductive region 17 made of $n^+$-silicon are formed in the silicon layer 10. An insulating layer 7 is formed on the electrode 15.

In the case of the aforementioned semiconductor device shown in FIG. 3, since the film thickness of the silicon thin film 14 disposed at the bottom of the recessed portion 11 is very thin, the resistance thereof becomes high, thereby allowing the silicon thin film 14 to be functioned as a tunneling barrier. Therefore, when the voltage of the electrode 11 is controlled, the concentration of electrons can-be adjusted, thereby making it possible to change the effective tunneling resistance.

Since it is possible according to the second embodiment of this invention to control the effective tunneling resistance in this manner, a circuit utilizing the Coulomb blockade effect which functions unidirectionally in a single-electron device can be prepared.

The structure shown in FIG. 3 may be disposed side by side in a row so as to effect the Coulomb blockade property in each portion in accordance with the voltage of the electrode 15.

Next, as another example of the second embodiment of this invention, the construction of semiconductor device having a pair of the structure shown in FIG. 3 and a method of manufacturing such a construction of semiconductor device will be explained with reference to FIGS. 4A to 4D.

Figure 4A:
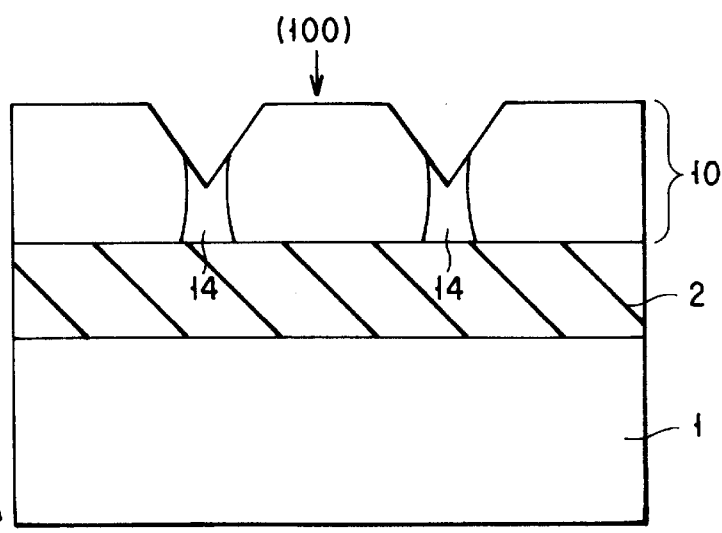

First of all, the insulating layer 2 made of $SiO_2$ is formed on the silicon substrate 1, and then the silicon layer 10 having an upper surface 8 of a (100) face is formed on the insulating layer 2 to obtain an SOI substrate as shown in FIG. 4A. The thickness of the silicon layer 10 in this case may be in the range of 0.001 to 10 μm, e.g. 0.1 μm.

Then, a part of the silicon layer 10 of the SOI substrate is removed by means of anisotropic etching using a TMAH solution and taking advantage of the (100) face of the silicon layer 10, thereby forming a tapered recessed portion (or a V-shaped recessed portion) 11. This V-shaped recessed portion 11 in this case is formed so as to leave a very thin silicon film 14 on the insulating layer without exposing the insulating layer. The size of the opening of the V-shaped recessed portion 11 may be in the range of 0.002 to 10 μm, e.g. 0.1 μm. The size of this degree can be easily manufactured by making use of the ordinary photolithographic technique.

Then, as shown in FIG. 4B, an oxide film 5 is formed all over the upper surface of the SOI substrate by means of thermal oxidation for instance, thereby forming an oxide (insulating) film 5 also on the inner surface 12 of the V-shaped recessed portion 11. The thickness of the oxide film 5 should preferably be in the range of 5 to 100 angstroms, e.g. 50 angstroms.

Thereafter, an electrode 5 for controlling a tunneling effect is formed in the recessed portion 11 as shown in FIG. 4C. This electrode 5 may be prepared by vapor-depositing polysilicon therein. Then, an n-type impurity, e.g. phosphorous ion is implanted into the silicon layer 10, thereby forming a source region 16, an island 17 and the drain region 18. Since the electrode 15 is disposed on the silicon thin film 14 in this case, the electrode 15 functions as a mask whereby preventing the implantation of ion into the silicon thin film 14, thus forming a tunnel region 14-L and a tunnel region 14-R.

Then, as shown in FIG. 4D, an interlayer insulating film 19 is deposited all over the resultant device, and a portion of the insulating film 19 that is located on the island 17 is etched away to form a contact hole therein, thereby accomplishing the manufacture of a single-electrode device.

It is possible according to this single-electron device having the aforementioned structure to allow electrons to pass through one by one from the source region 16 via the tunnel region 14-L to the island 17, and then from the island 17 via the tunnel region 14-R to the drain 18. It is also possible in this case to give a directionality to the electrons to be passed through the tunnel region 14-L and the tunnel region 14-R each functioning as a tunneling barrier by controlling the voltage to be applied to the electrode 15. For example, if the voltage (gate voltage) VGL to be applied to the left side gate is made larger than the gate voltage VGR to be applied to the right side gate, the width of the inversion layer to be generated in the left side tunnel region 14-L becomes larger than that to be generated in the right side tunnel region 14-R, so that the number of electrons passing into the island 17 from the source region 16 becomes larger than the number of electrons passing into the drain region 18 from the island 17, thereby making it possible to control the tunneling of electrons. The capacity of these tunneling regions may be $10^{-18}$F for instance.

In the above embodiment, the source region 16, the island 17 and the drain region 18 are formed of an $n^+$-type silicon. However, these regions may be formed of a $p^+$-type silicon. Furthermore, the electrode 15 for controlling the tunneling resistance is formed by making use of polysilicon in the above embodiment, it is also possible employ other kinds of metal such as aluminum in place of polysilicon.

Next, this invention will be further explained with reference to a semiconductor device where a plurality of single-electron device structures according to the second embodiment of this invention are arranged side by side.

Figure 5:
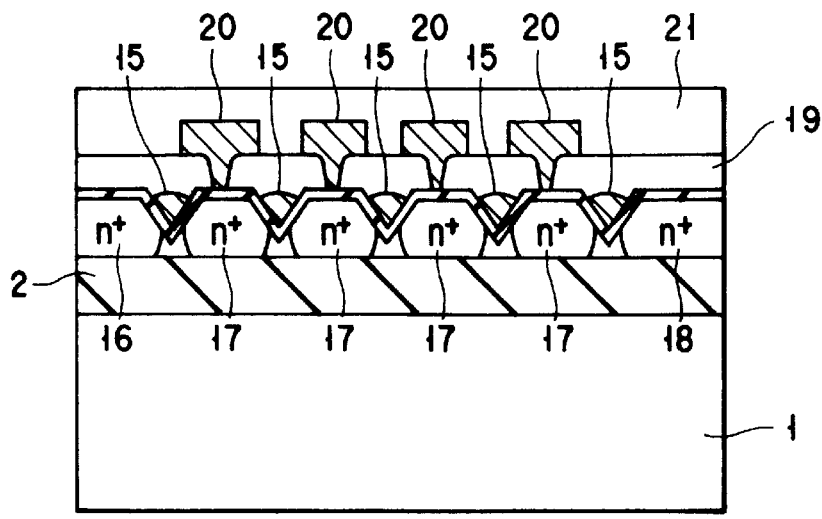
FIG. 5 is a cross-sectional view showing another example of a single-electron device according to a second embodiment of this invention.

FIG. 5 illustrates a cross-sectional view of such a semiconductor device, wherein four islands 17 having a single-electron device structure explained above are arranged side by side, thereby making it possible to allow electrons to pass one by one from the source region 16 via the island 17 to the drain region 18.

Figure 6:
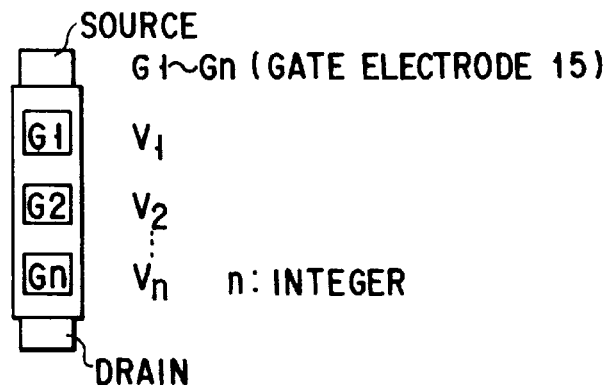
FIG. 6 is a plan view illustrating a single-electron device shown in FIG. 5.

FIG. 6 illustrates one example where a single-electron device having such a large number of electrodes is applied to. In this case, all of the voltages $V_1$ to $V_n$ (n is an integer) to be impressed on the portions ($G_1$, $G_2$, - - - , $G_n$) each corresponding to the gate electrode of the single-electron device shown in FIG. 5 are required to be higher than the threshold voltage so at allow an electron to pass through the corresponding channel region 14 of electron. Otherwise, it is impossible to cause an electric current to flow from the source region to the drain region. Therefore, by making use of this structure, a threshold circuit adapted to the voltages $V_1$ to $V_n$ can be fabricated.

Although an SOI substrate was employed in the above embodiment, it is also possible to employ other kinds of substrate where a semiconductor film is formed on the substrate via an insulating layer or a substance having a high band gap.

According to the first and second embodiments of this invention, a gate electrode is formed on the tunneling barrier wall, thereby making it possible not only to control the tunneling probability and adjust the Coulomb blockade effect, but also to give a directionality to the electrons tunneling through a single-electron device, thus enhancing the functionality of the single-electron device in a circuit.

According to the first and second embodiments of this invention, by making use of an SOI substrate and an anisotropic etching to the (100) face of a silicon layer, an element of very fine structure is formed, the resultant element being utilized as a capacitance functioning as a tunneling barrier for manufacturing various kinds of semiconductor devices that can be operated at room temperature.

In the first and second embodiments of this invention, a back gate structure may be employed in order to control the tunneling of electrons.

Next, a third embodiment of this invention will be explained as follows.

In the single-electron device according to the third embodiment of this invention, the tunneling barrier portion is constructed to have a conductive region of small area. The area of this tunneling barrier portion may preferably be 0.001 μm×0.001 μm to 1 μm×10 μm, e.g. 0.1 μm×0.01 μm. The thickness of this tunneling barrier portion may preferably be 50 to 500 angstroms, e.g. 100 angstroms. The size of this degree can be easily manufactured by making use of the ordinary photolithographic technique without requiring any specific working technique. The capacity of this tunneling barrier portion may be $10^{-18}$ F for instance.

If the area of the tunneling barrier portion is larger than the aforementioned range, it would be impossible to form a tunneling barrier. On the other hand, if the area of the tunneling barrier portion is smaller than the aforementioned range, the processing thereof may become very difficult.

As explained above, the tunneling barrier in the single-electron device according to this invention may be fabricated by making use of the same material or a material having the same degree of conductivity as the conductive portions such as a source region or a drain region instead of employing an insulating film having a high barrier or a semiconductor having a large band gap which has been conventionally employed. According to this invention, the cross-sectional area for passing an electric current is reduced, thereby enabling it to function as a tunneling barrier.

Moreover, since the gate electrode is mounted on the upper portion of the tunneling barrier portion via an insulating layer or a semiconductor layer having a large band gap, it is possible with this gate electrode to control the effective tunneling resistance. Therefore, it is possible to apply it to a circuit requiring the Coulomb blockade property which functions unidirectionally in a single-electron device. Furthermore, even if a plurality of such a single-electrode devices are uniformly fabricated, it is possible to realize the Coulomb blockade performance suited for each portion of a circuit that can be effected depending on a voltage to be applied to the gate electrode.

Next, a specific example of single-electron device according to a third embodiment of this invention will be explained with reference to drawings.

Figure 7A:
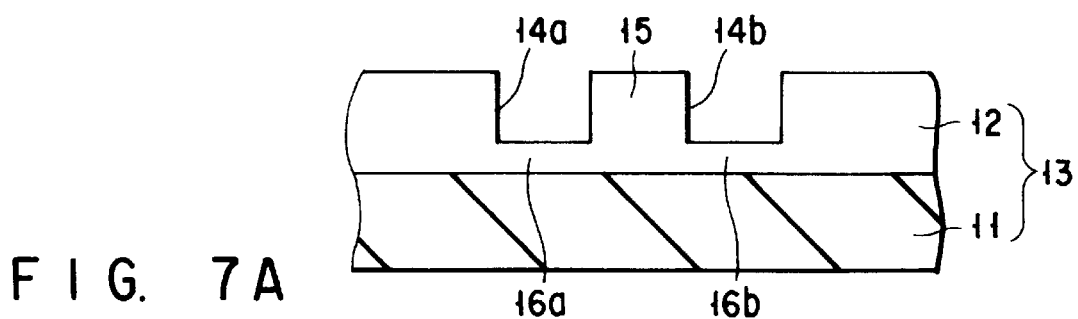
FIGS. 7A to 7F are cross-sectional views showing a process for manufacturing a single-electron device according to a third embodiment of this invention.

FIGS. 7A to 7F show cross-sectional views illustrating the steps for manufacturing a single-electron device according to a third embodiment of this invention by making use of a Si material. First of all, an SOI substrate 13 comprising a $SiO_2$ layer 11 and a Si layer 12 formed on the $SiO_2$ layer 11 is prepared, and a portion of the Si layer 12 that will be subsequently turned into a tunneling barrier is selectively etched using ammonium fluoride, thereby forming holes 14a and 14b, leaving a Si layer 15 of island-shape (FIG. 7A). In this case, the etching is performed such that thin Si layers 16a and 16b to be functioned as a tunneling film are left underneath each bottom of the holes 14a and 14b. Alternatively, the Si layer underneath the bottom of the holes 14a and 14b may be completely etched away, and then a thin Si layer may be subsequently formed on the bottom of the holes 14a and 14b by means of an epitaxial growth.

Figure 7B:
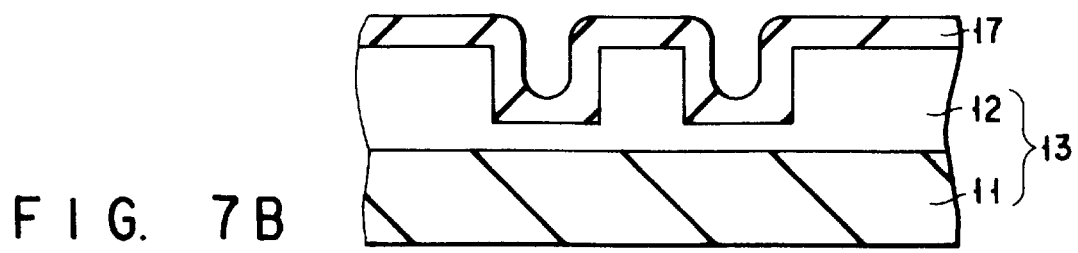
Figure 7C:
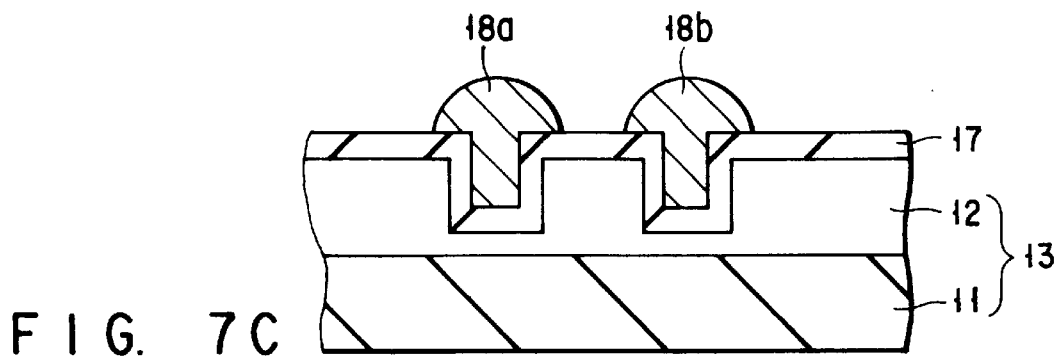
Figure 7D:
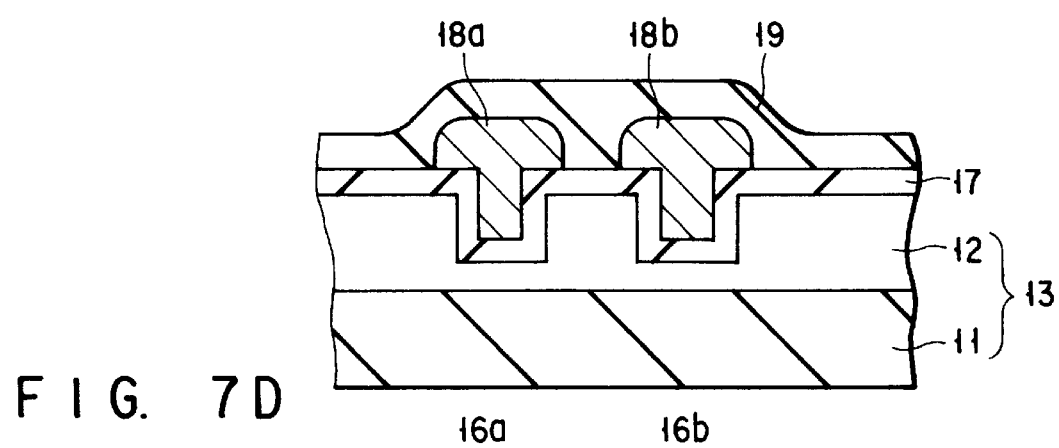

Then, a $SiO_2$ film 17 is deposited all over the surface of the Si layer 12 (FIG. 7B). In the case of Si, it is the width of an inversion layer that control the effective thickness of the tunneling barrier. Then, gate electrodes 18a and 18b are formed on that portions of the $SiO_2$ film 17 which are positioned on the Si layers 16a and 16b respectively, so as to control the inversion layer defining an effective passing width of the tunneling barrier. These gate electrodes 18a and 18b can be formed by the steps of depositing a polysilicon film all over the $SiO_2$ film 17 including the interiors of the holes 14a and 14b, and then patterning the polysilicon film (FIG. 7C).

Figure 7E:
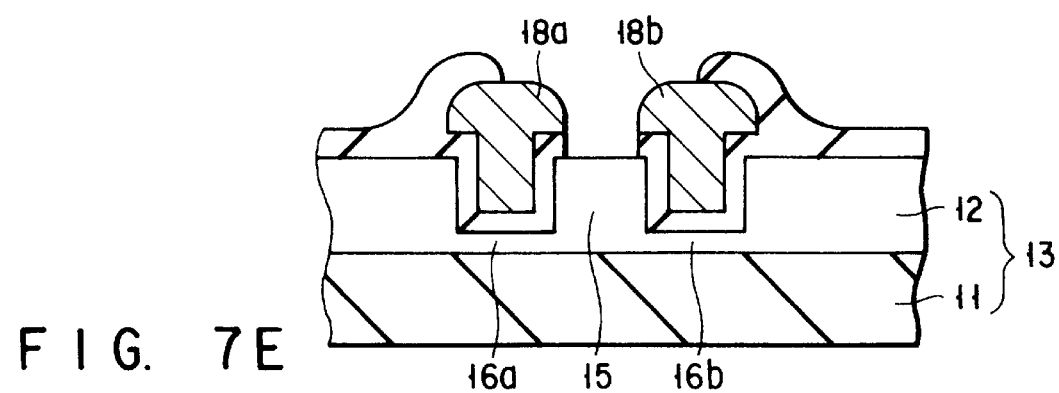
Figure 7F:
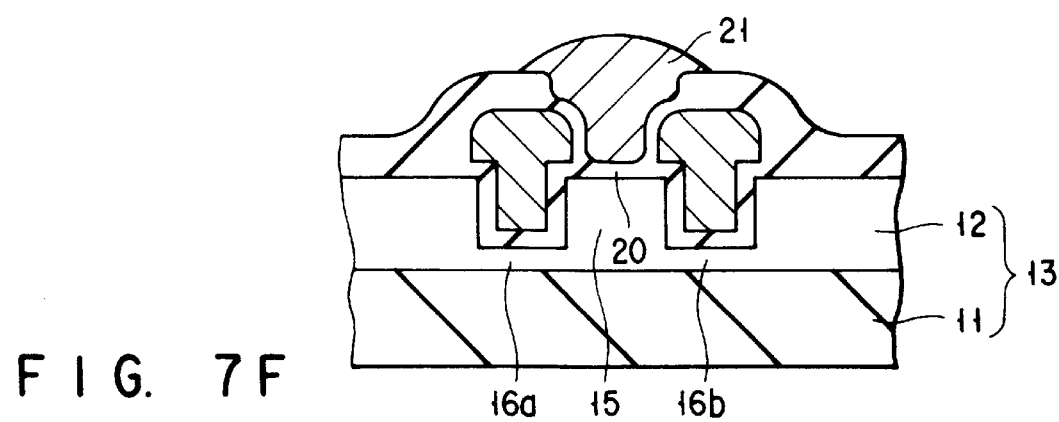

Thereafter, a SiO$_2$ film 19 functioning as an interlayer insulating film is formed (FIG. 7D) and then etched with the gate electrodes 18a and 18b being employed as a mask so as to expose the upper surface of the Si layer 15 of island shape (FIG. 7E). Subsequently, another SiO$_2$ film 20 is formed on the aforementioned exposed surface of the Si layer 15. After depositing polysilicon all over the exposed surface, the resultant polysilicon layer is patterned and then a gate electrode 21 is formed over the Si layer 15 with the SiO$_2$ film 20 being interposed therebetween, thereby accomplishing a single-electrode device (FIG. 7F). It may be required to dope this electrode with n$^+$ or p$^+$ ions in order to enhance the conductivity thereof.

Figure 8A:
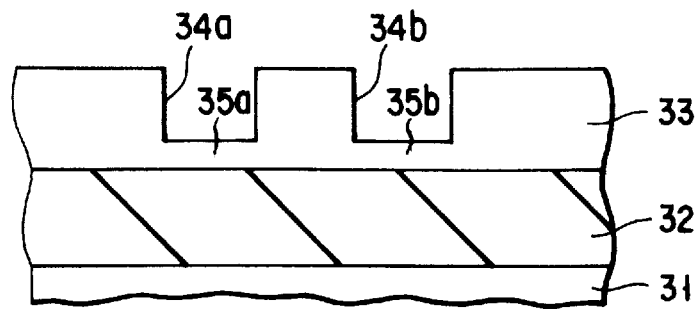
FIGS. 8A to 8F are cross-sectional views showing another process for manufacturing a single-electron device according to a third embodiment of this invention.

FIGS. 8A to 8F show cross-sectional views illustrating the steps for manufacturing a single-electron device according to a third embodiment of this invention by making use of a GaAs substrate. First of all, an AlGaAs layer 32 is allowed to grow on the GaAs substrate. After a GaAs layer 33 is further allowed to grow on the AlGaAs layer 32, a part of the GaAs layer 33 to be a tunneling barrier is selectively etched using a mixed solution of H$_3$PO$_4$/H$_2$O$_2$/H$_2$O, thereby forming holes 34a and 34b (FIG. 8A). In this case, the etching may be performed to such an extent that the surface of the AlGaAs layer 32 is exposed, or to such an extent that thin GaAs layers 35a and 35b are left on the AlGaAs layer 32. In the case of the former method, another a GaAs layer is subsequently formed on the surface of the AlGaAs layer 32, thereby forming thin GaAs layers 35a and 35b as a tunnel film. These thin GaAs layers 35a and 35b are of course required to be thinner than that of neighboring GaAs islands.

Figure 8B:
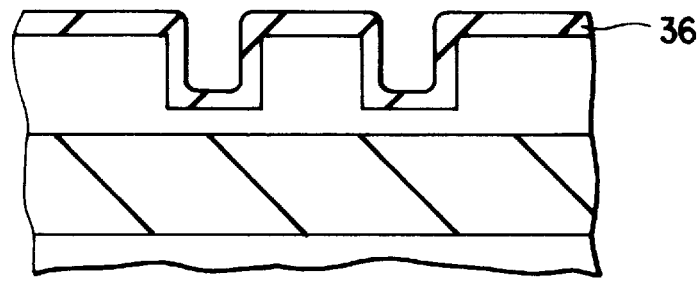
Figure 8C:
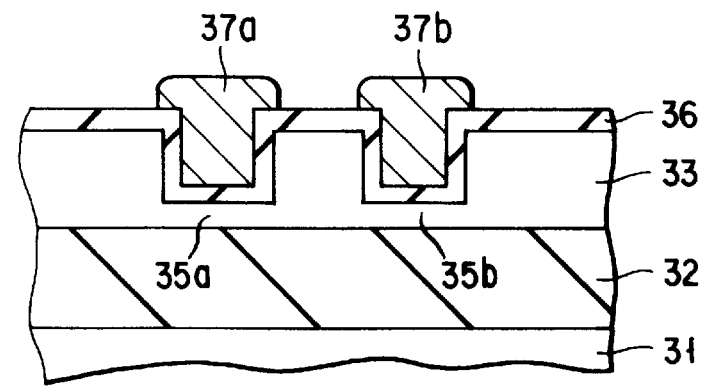
Figure 8D:
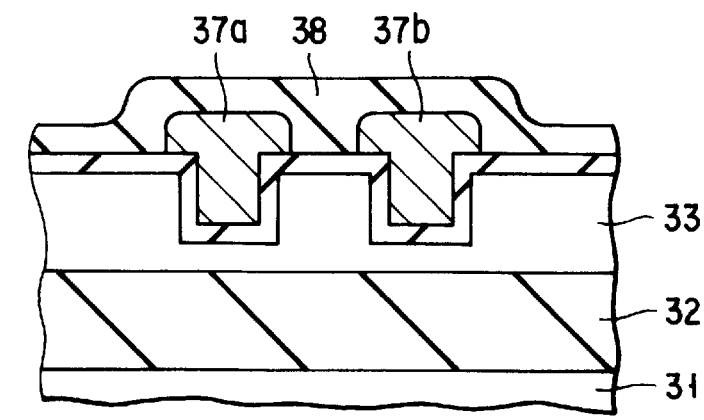

Then, an AlGaAs layer 36 is grown all over the surface of the GaAs layer 33 including the inner surface of the holes 34a and 34b (FIG. 8B). Subsequently, n$^+$ GaAs electrodes 37a and 37b are formed respectively above the GaAs layers 35a and 35b each functioning as a tunnel film so as to control the inversion layer defining an effective width of the tunneling barrier (FIG. 8C).

Figure 8E:
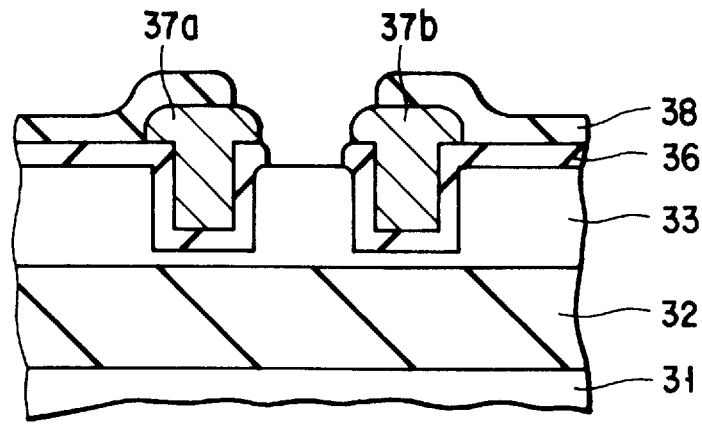
Figure 8F:
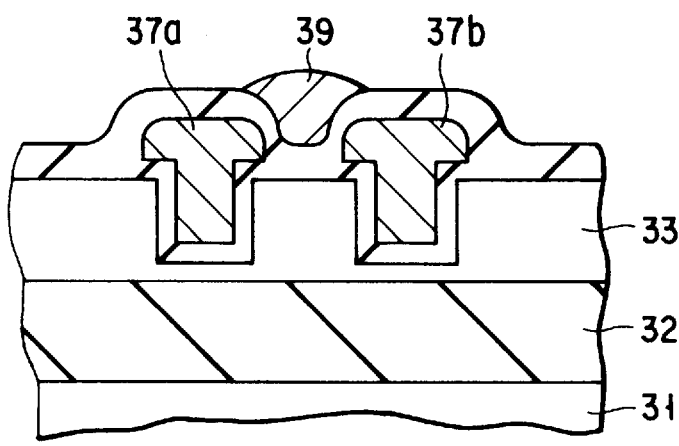

Thereafter, an AlGaAs film 38 is formed all over the exposed surface of the substrate (FIG. 8D) and then selectively etched so as to expose the upper surface of the AlGaAs film 33 of island shape (FIG. 8E). Subsequently, another thin AlGaAs film 38 is formed on the aforementioned exposed surface of the AlGaAs film 33, and then an n$^+$ GaAs electrode 39 is formed on this AlGaAs film 38 (FIG. 8F).

As a result of these procedures, a single-electrode device where the effective thickness of tunnel film is controlled and the directionality of tunneling is provided can be manufactured.

Figure 9:
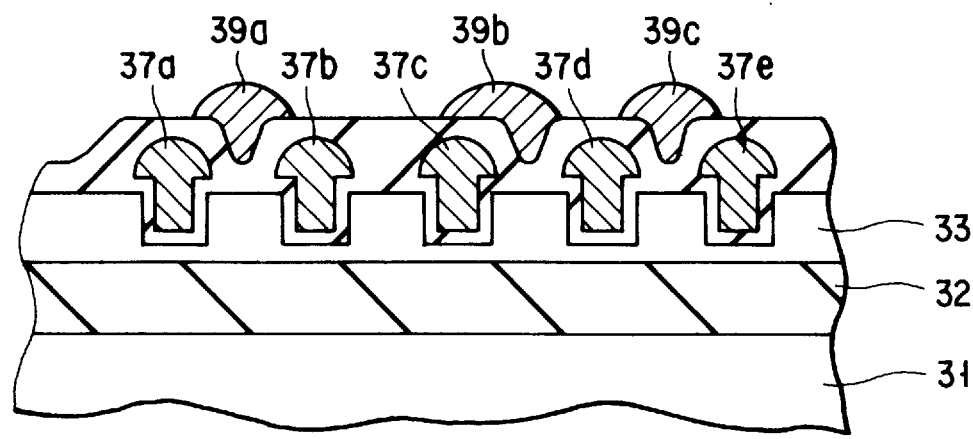
FIG. 9 is a cross-sectional view showing another example of a single-electron device according to a third embodiment of this invention.

In the embodiments shown in FIGS. 7A to 8F, single-electrode devices provided with a couple of tunneling barriers are exemplified. However, the number of tunneling barrier as well as the number of gate electrodes 37a to 37e and 39a to 39c may be increased further as shown in FIG. 9, i.e. there is no limitation on the number of these components. Further, in the method of crystal growth shown in FIGS. 8A to 8F, although GaAs/AlGaAs type compounds are employed, these materials may be replaced by other materials such as InP or InAlAs.

As explained above, in the semiconductor device according to the third embodiment of this invention, the tunneling barrier portion is constituted by a narrow conductive region. Therefore, it has become possible to prepare a single-electrode device in a relatively simple manner and with high controllability in spite of the conventional understandings that such a single-electrode device can never be manufactured without resorting to a special technique.

Furthermore, since a gate electrode is formed on the tunneling barrier wall, it has become possible not only to control the tunneling probability and adjust the Coulomb blockade effect, but also to give a directionality to the electrons tunneling through a single-electron device, thus enhancing the functionality of the single-electron device in a circuit.

In the third embodiment of this invention, a back gate structure may be employed in order to control the tunneling of electrons.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device which comprises:
    a substrate structure including a silicon substrate, an insulating layer formed on the silicon substrate, and a silicon layer having an exposed surface constituted by a Si (100) face, said silicon layer being provided with a tapered recess having a bottom at which a part of said insulating layer is exposed;
    a first insulating film formed on an inner surface of said tapered recess, which enables an electron to pass therethrough due to a tunneling effect;
    a first conductive region formed in said tapered recess;
    a second and a third conductive regions formed on both sides of said tapered recess respectively; and
    an electrode coupled to said first conductive region;
    wherein a flow of electron resulting from the tunneling effect from said second conductive region via said first insulating film to said first conductive region, and from said first conductive region via said first insulating film to said third conductive region is controlled by controlling a voltage to be impressed onto said electrode.

2. The semiconductor device according to claim 1, which further comprises a second insulating film formed on said conductive region, and in which said electrode is formed on said first conductive region.

3. The semiconductor device according to claim 1, wherein a width of an opening of said recess is in the range of 0.002 to 10 $\mu$m, and a width of a bottom of said recess is in the range of 6 to 10$^5$ angstroms.

4. The semiconductor device according to claim 1, wherein a thickness of said silicon layer is in the range of 10 to 50,000 angstroms.

5. The semiconductor device according to claim 1, wherein a thickness of said first insulating film is in the range of 5 to 100 angstroms.

6. The semiconductor device according to claim 1, wherein said first conductive region is formed of polysilicon.

7. A semiconductor device which comprises:
    a substrate;
    an insulating layer formed on the substrate;
    a silicon layer having an exposed surface constituted by a Si (100) face, said silicon layer being provided with a plurality of tapered recesses with each recess having a bottom at which a part of said silicon layer remains without exposing said insulating layer;
    first conductive regions constituted by said silicon layer remaining at said bottom of each said tapered recess; and second and third conductive regions formed on respective sides of each of said tapered recesses, wherein said first conductive regions function as tunneling barriers and directionality is provided to electrons allowed to pass through the tunneling barriers by controlling a barrier height of each tunneling barrier.

8. A semiconductor device which comprises:

a substrate;

an insulating layer formed on the substrate;

a silicon layer having an exposed surface constituted by a Si (100) face, said silicon layer being provided with a plurality of tapered recesses with each recess having a bottom at which a part of said silicon layer remains without exposing said insulating layer;

first conductive regions constituted by said silicon layer remaining at said bottom of each said tapered recess;

second and third conductive regions formed on respective sides of each of said tapered recesses:

an insulating film, formed on said silicon layer and inner surfaces of said tapered recesses; and a plurality of electrodes formed on said insulating film formed on said inner surfaces of said tapered recesses, wherein a flow of electrons resulting from the tunneling effect from the second conductive region to the third conductive region is controlled by a controlling a voltage impressed onto each of said electrodes.

9. A semiconductor device which comprises:

a semiconductor substrate;

a plurality of conductive sections formed on said semiconductor substrate;

a plurality of tunneling barriers each constituted by a conductive region connected to each said conductive section and having an thickness smaller than that of said conductive section on said semiconductor substrate;

an insulating layer formed on said tunneling barriers; and a plurality of electrodes formed on said insulating layer, wherein a flow of tunneling effect electrons from one conductive section via one of said tunneling barriers to an adjacent conductive section is controlled by controlling a voltage to be impressed onto one of said electrodes.

10. A semiconductor device which comprises:

a semiconductor substrate;

a plurality of conductive sections formed on said semiconductor substrate; and a plurality of tunneling barriers each constituted by a conductive region connected to said conductive section and having a thickness smaller than that of said conductive section on said semiconductor substrate, wherein said semiconductor substrate comprises a GaAs substrate, an AlGaAs layer formed on said GaAs substrate, and a GaAs layer formed on said AlGaAs layer.

11. The semiconductor device according to claim 7, wherein a width of an opening of said recess is in the range of 0.002 to 10 $\mu$m, and a width of the bottom of said recess is in the range of 6 to $10^5$ angstroms.

12. The semiconductor device according to claim 7, wherein a thickness of said silicon layer is in the range of 10 to 50,000 angstroms.

13. The semiconductor device according to claim 7, wherein a thickness of said first conductive region is in the range of 5 to 100 angstroms.

14. The semiconductor device according to claim 7, wherein said second and third conductive regions are formed of polysilicon.

15. A semiconductor device which comprises:

a substrate;

an insulating layer formed on the substrate;

a silicon layer having an exposed surface constituted by a Si (100) face, said silicon layer being provided with a plurality of tapered recesses each having a bottom at which a part of said silicon layer remains without exposing said insulating layer;

a plurality of first conductive regions each constituted by said silicon layer remaining at said bottom of said tapered recess;

a second conductive region formed on one outermost side of said plurality of first conductive regions;

a third conductive region formed on the other outermost side of said plurality of first conductive regions;

a plurality of fourth conductive regions each formed between a pair of said first conductive regions;

an insulating film formed on an inner surface of each of said tapered recesses and on each of said fourth conductive regions;

a first electrode formed on a portion of said insulating film that is formed on said inner surface of each of said tapered recesses; and a second electrode formed on a portion of said insulating film that is formed on each of said fourth conductive regions.

16. The semiconductor device according to claim 15, wherein a width of an opening of said recess is in the range of 0.002 to 10 $\mu$m, and a width of a bottom of said recess is in the range of 6 to $10^5$ angstroms.

17. The semiconductor device according to claim 15, wherein a thickness of said silicon layer is in the range of 2 to $2 \times 10^4$ angstroms.

18. The semiconductor device according to claim 15, wherein a thickness of said first conductive region is in the range of 2 to $2 \times 10^4$ angstroms.

19. The semiconductor device according to claim 15, wherein said first and second electrodes are formed of polysilicon.

20. The semiconductor device according to claim 9, wherein an area of said tunneling barrier is in the range of 0.001 $\mu$m$\times$0.001 $\mu$m to 1 $\mu$m$\times$10 $\mu$m, and a thickness of said tunneling barrier is 5 to 50 nm.

21. The semiconductor device according to claim 9, wherein said semiconductor substrate comprises a silicon substrate, a SiO$_2$ layer formed on said silicon substrate, and a silicon layer formed on said SiO$_2$ layer.

* * * * *